United States Patent [19]
Bates et al.

[11] Patent Number: 4,660,182
[45] Date of Patent: Apr. 21, 1987

[54] PROGRAMMABLE MULTICHANNEL SONOBUOY TRANSMITTER

[75] Inventors: Albert M. Bates, Southampton; Wayne H. Sandford, Jr., Warrington; Michael T. Junod, Southampton, all of Pa.

[73] Assignee: The Unites States of America as represented by the Secretary of the Navy, Washington, D.C.

[21] Appl. No.: 622,369

[22] Filed: Jun. 20, 1984

[51] Int. Cl.⁴ ............................................. H04B 7/00
[52] U.S. Cl. ..................................... 367/3; 455/112; 455/119
[58] Field of Search ........................................ 367/3–5, 367/137; 455/113, 116, 119, 103, 112, 260; 332/19; 331/25; 328/155

[56] References Cited

U.S. PATENT DOCUMENTS 3,701,088 10/1972 Hasse et al. .............................. 367/3
3,860,874 1/1975 Malone et al. ........................ 325/320
4,068,198 1/1978 Otto ....................................... 332/19
4,114,110 9/1978 Nossen ..................................... 331/2
4,259,744 3/1981 Junod et al. ......................... 455/103
4,494,090 1/1985 Popek et al. ......................... 455/113
4,501,019 2/1985 Matsukura et al. ................. 455/112

Primary Examiner—Thomas H. Tarcza
Assistant Examiner—Daniel T. Pihulic
Attorney, Agent, or Firm—Robert F. Beers; Henry Hansen

[57] ABSTRACT

A programmable phase-locked loop frequency synthesizer for a multi-channel sonobuoy transmitter is disclosed. The phase-locked loop, including a counter/divider utilizing variable modulus prescaling techniques, is modulated at its voltage-controlled oscillator (VCO) by an external signal which is preemphasized by a compensation network in order to correct for the roll-off characteristic response of the loop below its natural frequency.

3 Claims, 6 Drawing Figures

PROGRAMMABLE MULTICHANNEL SONOBUOY TRANSMITTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to transmitters, and more particularly to sonobuoy transmitters in which a phase-locked loop is modulated in order to transmit acoustic data with multichannel programmability.

Prior art approaches to sonobuoy technology have generally been limited to fixed, single channel RF transmitters tuned at the factory to one of a number of available channels. Accordingly, operational facilities are forced to carry an inventory having a number of units of each channel, and are unable to change that channel inventory without restocking. Furthermore, because of the increase in antisubmarine warfare activities in recent years combined with the restrictive nature of such sonobuoy inventories, operational facilities are faced with such problems as: (1) the presence of interference caused by using similarly channeled sonobuoys in close proximity to one another; (2) the redundancy caused in coordinated operations by different platforms carrying similarly channeled payloads; and (3) the inability of individual platforms to complete their mission requirements when their predetermined payload will not satisfy changing tactical environments.

SUMMARY OF THE INVENTION

Accordingly, it is a general purpose of the present invention to provide a sonobuoy transmitter capable of serially transmitting any one of a number of independent frequencies.

Another object of the present invention is to provide a sonobuoy transmitter in which a desired frequency may be programmed in the field.

A further object of the present invention is to provide a sonobuoy transmitter having higher frequency stability and lower unit cost.

Still another object of the present invention to provide a sonobuoy transmitter which increases mission effectiveness while reducing inventory costs.

Briefly, these and other objects of the present invention are accomplished by a programmable multichannel sonobuoy transmitter including a phase-locked loop which is modulated in order to transmit acquired acoustic data. Within the loop, a VCO (voltage-controlled oscillator) receives a modulation signal through a compensation network that corrects for the roll-off characteristic of the loop's response, and an independent tuning signal to generate an output frequency. A programmable counter/divider divides this frequency by a factor N corresponding to the selected channel, and the output thereof is compared in a phase detector with a reference frequency generated by a crystal oscillator. If the divided and reference frequencies differ in phase, an error voltage is generated at the phase detector and modified by a filter into a ramp voltage with the proper loop response. The ramp voltage is subsequently applied to the VCO as the tuning signal to change the output frequency in a direction which decreases the error voltage until phase lock occurs and the output frequency is stabilized. When another channel is desired, the corresponding factor N is changed in the counter/divider, and a new error voltage generated until the loop locks on the new output frequency.

Other objects, advantages and novel features of the invention will become apparent from the following detailed description of the invention when considered in conjunction with the accompanying drawings wherein:

DESCRIPTION OF THE PREFERRED EMBODIMENT

Figure 1:
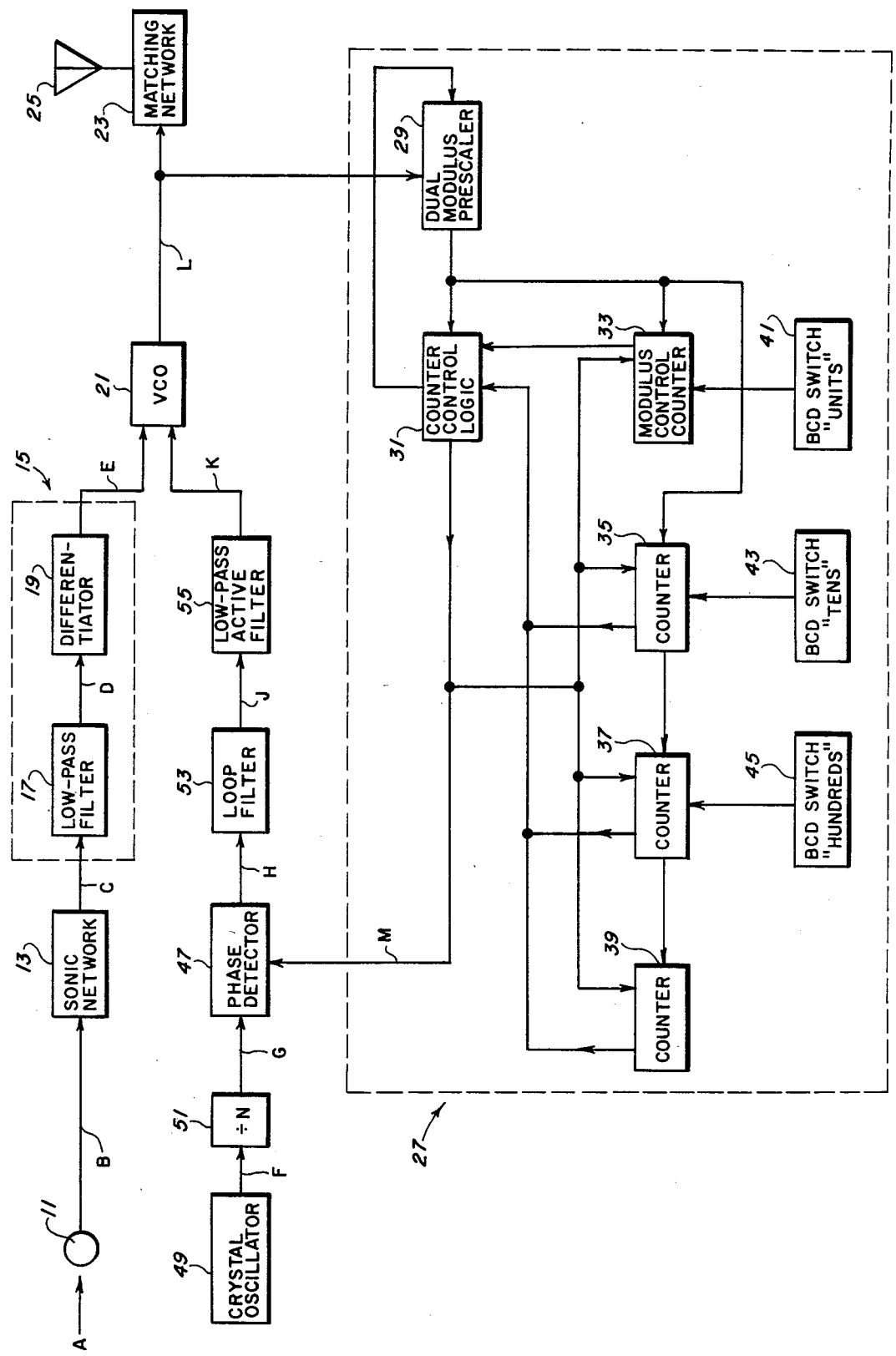
FIG. 1 is a block diagram of a programmable multichannel sonobuoy transmitter including a phase-locked loop according to the present invention.

Referring now to the drawings, there is shown in FIG. 1 a programmable multichannel sonobuoy transmitter which utilizes a phase-locked loop technique to perform frequency synthesis by variable modulus prescaling. This technique is well known in the art. See *Phase-Locked Loop Systems Data Book*, 2d Ed., 1973 Motorola Semiconductor Products, Inc..

Responding to a broadband water-borne acoustic signal A, a hydrophone 11 delivers an essentially equivalent electric signal B, typically in the range of up to 20,000 hertz, to a sonic network 13 which is configured to amplify and filter signal B for further processing as signal C. Signal C is then applied to a compensation network, generally designated 15 and including a low-pass filter 17 and differentiator 19, which operates as described herein below to produce a modulating signal E.

In addition to a tuning voltage signal K, infra, modulating signal E is next applied to a VCO (voltage-controlled oscillator) 21, from which a frequency modulated signal L is produced and further applied to an antenna 25, through its matching network 23, and the counter-divider portion of the phase-locked loop, generally designated 27.

Within counter-divider portion 27, a dual modulus prescaler 29 also receives signal L, and in conjunction with a counter control logic 31, a modulus control counter 33, and cascaded programmable counters 35, 37 and 39, divides signal L according to the channel selected by three decade BCD (binary coded decimal) switches 41, 43 and 45 individually connected to the counters 33, 35 and 37 respectively. BCD switch 41 represents "units", switch 43 "tens", and switch 45 "hundreds". Since in this preferred embodiment no channel designation is below 1000 or above 1999, counter 39 is fixed programmed to "1". However, it should be noted that if a channel designation below 1000 or above 1999 is required, an additional BCD switch or its equivalent may be connected thereto in accordance with the present invention.

Signal L so divided, now designated signal M, is applied to a phase detector 47 which, upon application of a constant reference signal G, produced by a crystal oscillator 49 as signal F and divided by a divider 51, will compare the incoming phases of signals G and M and produce a voltage error signal H should signals G and M be out of phase. Fundamental phase-locked loop characteristics such as capture range, loop bandwidth, capture time, and transient response are controlled by a loop filter 53 which receives signal H and passes it as signal J to a low-pass active filter 55 where the modulation bandwidth is set. The low-pass active filter 55 additionally amplifies signal J and passes it as tuning voltage signal K to VCO 21.

Figure 2A:
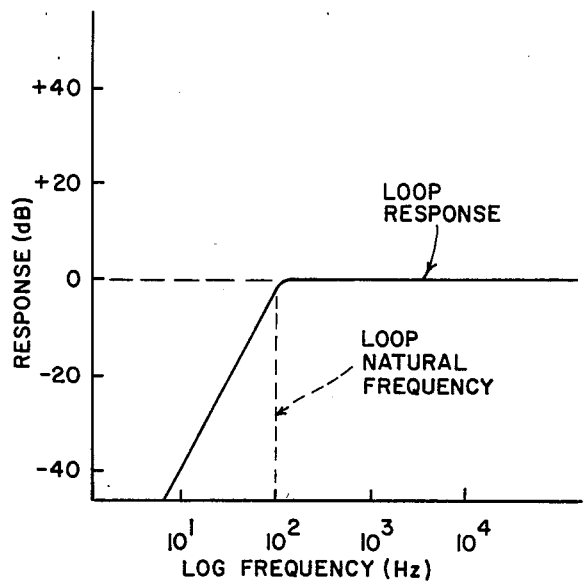
FIG. 2a–2d illustrate typical loop response and pre-emphasis characteristics as applied to the transmitter of FIG. 1.

As illustrated in FIG. 2a, modulation of a conventional VCO by an error signal, resulting from the introduction of an external noise source at the VCO in a closed loop situation, is typically a second order high pass function which has a roll off response with a slope of 12 dB/octave (40 dB/decade) at frequencies below a loop natural frequency. This means that noise components, or in this case data signals, in the VCO above the loop natural frequency will pass unattenuated and those below will have some degree of suppression.

Since the loop natural frequency, or loop bandwidth, is determined by and proportional to the gains of a phase detector and VCO and the factor N corresponding to the channel selected in the programmable counter/divider portion of a phase-locked loop, it becomes necessary to correct for loop response outside the loop itself. In order to prevent the suppression of data signals which have a frequency that is below the loop natural frequency, in this case 100 hertz, the present invention in accordance with FIG. 1 includes a compensation network 15 consisting of a low-pass filter 17 and a differentiator 19.

Figure 2B:
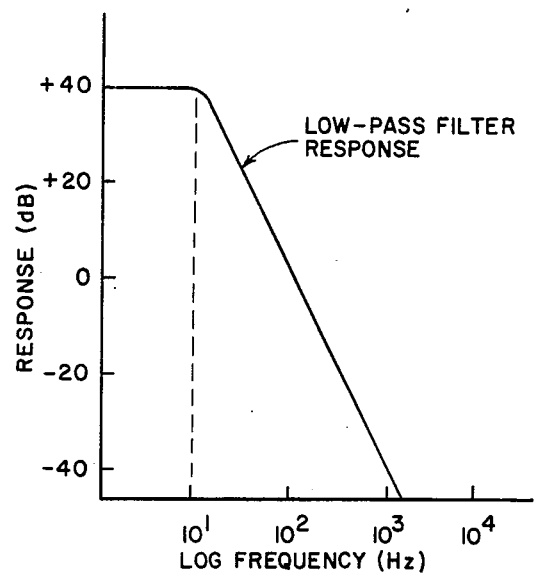

Referring now to FIG. 2b, there is shown a typical low-pass filter response which has a $-12$ dB/octave ($-40$ dB/decade) roll off from an initial gain of $+40$ dB when referenced to the loop response shown in FIG. 2a. According to the present invention, data signals below 10 hertz are neither desired nor contemplated for processing; therefore, low-pass filter 17 is selected to have a cut off frequency of 10 hertz. It should be further noted that since loop response in this case is a second order high-pass function, low-pass filter 17 must also be of a second order type.

Figure 2C:
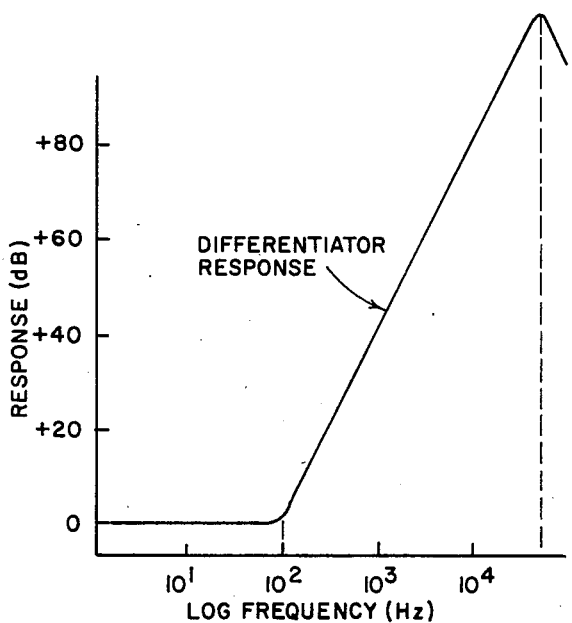
Figure 3:
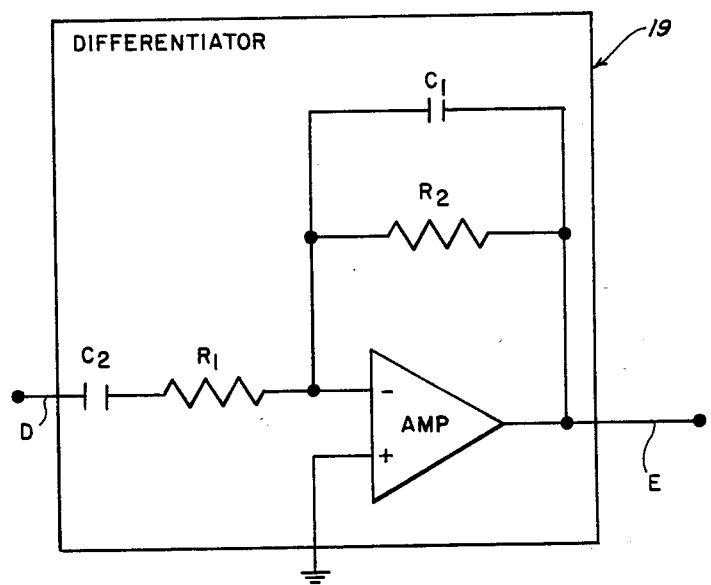
FIG. 3 is a schematic diagram of a differentiator used in the transmitter of FIG. 1.

Referring now to FIG. 2c, there is shown a response of differentiator 19 according to the present invention. Since the response of low-pass filter 17 is adequate to compensate for loop response only from its cut off frequency up to the loop natural frequency, differentiator 19 need only be operable above the loop natural frequency in order to compensate for additional signal suppression. Furthermore, since it is contemplated that the system of the present invention selectively transmits low frequency data signals, i.e. up to 20,000 hertz, differentiator 19 is generally configured as shown in FIG. 3, where:

$$\frac{1}{2\pi C_2 R_2} = 100 \text{ hertz} \qquad \text{(eq. 1)}$$

and $$f_c = \frac{1}{2\pi C_2 R_1} = \frac{1}{2\pi C_1 R_2} = 20,000 \text{ hertz} \qquad \text{(eq. 2)}$$

Figure 2D:
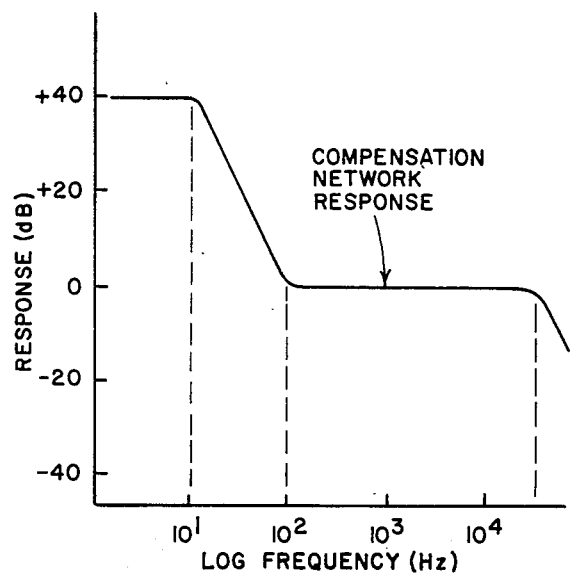

It follows, therefore, that the composite response of low-pass filter 17 and differentiator 19 can be represented by FIG. 2d. Between 10 and 100 hertz, data signals will be amplified at a rate that is inversely proportional to the loop response. Above the loop natural frequency of 100 hertz, differentiator 19 becomes operable and offsets the attenuation of low-pass filter 17.

Thus, the net effect over the range of 100–20,000 hertz is no gain or attenuation.

Having described in some detail the elements involved in the present invention, the following illustration will elucidate the operation of this preferred embodiment. The sonobuoy transmitter shown in FIG. 1 generates frequencies in the range from 136.0 to 173.5 megahertz with 375 kilohertz channel spacing. Since these frequencies are not integrally divisible, the crystal oscillator 49 and the divider 51 are so configured as to produce the constant reference signal G of 125.0 kilohertz. Therefore, the requirements for counter-divider portion 27 are determined from:

$$\text{Minimum divider ratio} = \frac{136.0 \text{ MHz}}{125.0 \text{ KHz}} = 1088 \qquad \text{(eq. 3)}$$

$$\text{Maximum divider ratio} = \frac{173.5 \text{ MHz}}{125.0 \text{ KHz}} = 1388 \qquad \text{(eq. 4)}$$

From the above it can be seen that in order to provide 99 channels, a change of three (3) in the divider ratio will correspond to a change of one (1) channel.

In operation, a dual modulus prescaler 29 divides by one of two predetermined moduli P or (P+1) which are dependent upon the particular characteristics desired. Dividing first by the upper modulus (P+1), prescaler 29 will continue to so divide by (P+1) for the number of times set into modulus control counter 33, an integer designated $N_{mc}$. By contrast, the number of times dual modulus prescaler 29 will divide by its lower modulus P is determined by the overall number set into counters 35, 37 and 39, an integer designated $N_{pc}-N_{mc}$. Thus, the total divisor of programmable counter/divider portion 27 can be defined by the equation:

$$N = PN_{pc} + N_{mc}$$

(eq. 5)

For every (P+1) pulse into dual modulus prescaler 29, the numbers set in modulus control counter 33 and counters 35, 37 and 39 are decremented by one. Dual modulus prescaler 29 divides by (P+1) until modulus control counter 33 reaches the zero state, at which point counter control logic 31 detects such and changes the modulus in dual modulus prescaler 29 to P.

At the end of $(P+1) \times N_{mc}$ pulses, the state of counters 35, 37 and 39 in their cascaded arrangement equals $(N_{pc}-N_{mc})$. With the modulus in dual modulus prescaler 29 now at P, it will divide by such until the remaining count $(N_{pc}-N_{mc})$ is decremented to zero. When that occurs, modulus control counter 33 and counters 35, 37 and 39 will reset to the channel designation selected and the cycle repeats.

In this preferred embodiment, dual modulus prescaler 29 is configured to divide by either P=10 or P+1=11. One suitable such prescaler is Model MC12012 manufactured by Motorola Semiconductor Products Inc. To further understand this prescaling technique, consider the case where a frequency modulated signal L of 145.375 megahertz (representing channel 57) is desired to be controlled by the phase-locked loop. Since the constant reference signal is 125.0 kilohertz, the total divisor or channel designation in the counter-divider portion 27 is defined by the equation:

$$N = PN_{pc} + N_{mc} = \frac{f_{out}}{f_{ref}} = \frac{145.375 \text{ MHz}}{125.0 \text{ KHz}} = 1163 \quad \text{(eq. 6)}$$

From the abovementioned discussion of the operation of dual modulus prescaler 29, it follows that the total divisor, N, also equals ($PN_{pc}+N_{mc}$); therefore, solving the simultaneous equations for $N_{pc}$ and $N_{mc}$, $N_{pc}$=116 and $N_{mc}$=3. Since counter 39 is fixed programmed to one, one need only set BCD switches 45, 43 and 41 to one, six and three respectively in order to program the counter-divider portion 27.

Thus, when frequency modulated signal L at 145.375 megahertz is applied to dual modulus prescaler 29, it will be divided by 11 three times as controlled by a setting of 3 in modulus control counter 33. The cascaded arrangement of counter 35, 37 and 39 will then have been decremented to 113; and upon shifting of the modulus to 10 in dual modulus prescaler 29, signal L will be further divided 113 more times by 10, for a total of (10(113)+11(3)) or 1163.

Some of the many advantages of the invention should now be readily apparent. For example, a novel and programmable multichannel sonobuoy transmitter has been provided which is capable of serially transmitting any one of a number of independent frequencies, selectable in the field, through a common frequency correction loop. Thus, by using a single VCO and crystal reference oscillator in a phase-locked loop, the present invention eliminates the necessity for multiple oscillators while still providing a wide range of available channels. Furthermore, because the unit is field programmable, there is no need to maintain large inventories of fixed-channel sonobuoys.

Obviously, many modifications and variations of the present invention are possible in light of the above teachings. It is therefore to be understood that within the scope of the appended claims, the invention may be practiced otherwise than as specifically described.

What is claimed is:

1. A programmable RF transmitter for transmitting data with frequencies from 10 to 20,000 hertz on any one of a plurality of channels comprising in combination:
    compensating means for receiving and preemphasizing a data signal as a function of its frequency and producing a preemphasized signal;
    first oscillator means for receiving a voltage signal, which voltage signal causes said oscillator means to oscillate at a carrier frequency, and for receiving the preemphasized signal, which preemphasized signal modulates the carrier frequency, said oscillator means producing an output signal indicative of the preemphasized signal;
    second oscillator means for producing a reference signal of constant frequency;
    detector means for receiving the reference signal for phase comparing with a second input signal thereto and producing the voltage signal to said first oscillator means;
    programming means receiving the output signal of said first oscillator means for dividing the frequency thereof and producing the second input of said detector means; and
    antenna means receiving the output of said first oscillator means;
    whereby a constant modulation sensitivity is maintained over the entire range of modulating frequencies.

2. A programmable RF transmitter as in claim 1 wherein said compensating means comprises:
    a low-pass filter; and
    a differentiator connected in series with said low-pass filter.

3. A programmable RF transmitter according to claim 2, wherein said low-pass filter is configured to cutoff at ten hertz and said differentiator is operable in the range of 100 hertz to a cutoff frequency of 20,000 hertz.

* * * * *